(12) United States Patent
Penny et al.

(10) Patent No.: US 11,152,190 B2
(45) Date of Patent: Oct. 19, 2021

(54) CHARGED PARTICLE SCANNERS

(71) Applicant: Decision Sciences International Corporation, Poway, CA (US)

(72) Inventors: Robert D. Penny, San Diego, CA (US); Michael James Sossong, Ramona, CA (US); Matthew Steiger, El Cajon, CA (US); Young K. Lee, San Diego, CA (US)

(73) Assignee: Decision Sciences International Corporation, Poway, CA (US)

( * ) Notice: Subject to any disclaimer, the term of this patent is extended or adjusted under 35 U.S.C. 154(b) by 10 days.

(21) Appl. No.: 16/853,529

(22) Filed: Apr. 20, 2020

(65) Prior Publication Data

US 2020/0335299 A1    Oct. 22, 2020

Related U.S. Application Data

(60) Provisional application No. 62/836,012, filed on Apr. 18, 2019.

(51) Int. Cl.
| | | |
|---|---|---|
| *H01J 37/244* | (2006.01) | |
| *H01J 37/20* | (2006.01) | |
| *H01J 37/147* | (2006.01) | |

(52) U.S. Cl.
CPC ........ *H01J 37/244* (2013.01); *H01J 37/1475* (2013.01); *H01J 37/20* (2013.01); *H01J 2237/2443* (2013.01); *H01J 2237/2445* (2013.01); *H01J 2237/2446* (2013.01); *H01J 2237/24495* (2013.01); *H01J 2237/24578* (2013.01)

(58) Field of Classification Search
CPC ...... H01J 37/244; H01J 37/20; H01J 37/1475; H01J 2237/2446; H01J 2237/2445; H01J 2237/24578; H01J 2237/24495; H01J 2237/2443; G01V 5/0016
USPC ................................................. 250/310, 311
See application file for complete search history.

(56) References Cited

U.S. PATENT DOCUMENTS

| | | | | |
|---|---|---|---|---|
| 5,148,025 | A * | 9/1992 | Ahn | C23C 14/548 250/305 |
| 6,486,481 | B1 * | 11/2002 | Tigera | B29B 13/08 250/435 |
| 6,555,818 | B1 * | 4/2003 | Hosokawa | H01J 37/153 250/306 |
| 8,109,865 | B2 * | 2/2012 | Jackson | A61B 6/037 600/1 |
| 10,215,717 | B2 * | 2/2019 | Kurnadi | G01V 5/0016 |
| 10,918,888 | B2 * | 2/2021 | Ramezanzadeh Moghadam | A61N 5/1039 |
| 2012/0160999 | A1 * | 6/2012 | Zaluzec | H01J 37/244 250/307 |

(Continued)

*Primary Examiner* — David A Vanore
(74) *Attorney, Agent, or Firm* — Perkins Coie LLP

(57) ABSTRACT

A volume interrogation system can use an accelerated beam of charged particles to interrogate objects using charged-particle attenuation and scattering tomography to screen items such as electronic devices, packages, baggage, industrial products, or food products for the presence of materials of interest inside. The apparatus, systems, and methods in this patent document can be employed in checkpoint applications to scan items. Such checkpoint applications can include border crossings, mass transit terminals (subways, buses, railways, ferries, etc.), and government and private-sector facilities.

20 Claims, 13 Drawing Sheets

(56) References Cited

U.S. PATENT DOCUMENTS

2019/0378682 A1* 12/2019 Wang .................... H01L 31/085
2020/0333482 A1* 10/2020 Penny ....................... G01T 5/08
2020/0335299 A1* 10/2020 Penny .................. G01V 5/0016

* cited by examiner

CHARGED PARTICLE SCANNERS

CROSS REFERENCE TO RELATED APPLICATIONS

The present application claims the benefit of priority to U.S. Provisional Patent Application No. 62/836,012, filed Apr. 18, 2019. The entire contents of the before-mentioned patent application are incorporated by reference as part of the disclosure of this application.

TECHNICAL FIELD

This patent document relates to charged particle scanners for scanning various items.

BACKGROUND

Currently, scanning or screening technology is represented by single-energy or dual-energy X-ray imaging in two dimensions (2D). However, X-rays can have limited material discrimination capability because X-rays can measure only a single material property—the X-ray absorption coefficient. Thus, the use of X-ray technology can lead to either a high alert rate of possible threats or a low probability of detecting actual threats. The high alert rate causes a person to perform secondary inspection of many items, thus raising staffing requirements. And, the low probability of detecting actual threats means that some threats can pass through a checkpoint undetected, thus defeating a purpose of a security checkpoint.

SUMMARY

This patent document discloses apparatus, systems, and methods for detection of materials by measuring multiple coulomb scattering and attenuation of charged particles traversing a volume of interest (VOI). For example, an exemplary scanner for interrogating contents of a volume includes an accelerator structured to generate a beam of charged particles, a chamber located in a path of the beam of charged particles to receive the beam of charged particles, a beam distribution system located in the chamber to receive the beam of charged particles and structured to distribute the beam of charged particles over a range of incidence angles and positions, a scan-volume stage located in a path of the beam of charged particles from the chamber, the scan-volume stage configured to support an object to be scanned, and the scan-volume stage operable to move the object relative to the beam of charged particles, a first particle tracking detector located relative to the scan-volume stage to receive charged particles that transit through the object and to measure position and direction of the charged particles that transit through the object while allowing the charged particles to pass through, a calorimeter located relative to the first particle tracking detector to receive the charged particles from the first particle tracking detector and to measure the received charged particles to represent energy of the charged particles received by the first particle tracking detector, and a processor communicably coupled to the first particle tracking detector and the calorimeter to process information from the first particle tracking detector and the calorimeter to yield an estimate of a spatial map of atomic number and density of the object.

In some embodiments, the beam distribution system further comprises a bend magnet structured to receive the charged particles from the accelerator and structured to orient the electrons toward the object under inspection; and a plurality of scattering foils to receive the charged particles from the bend magnet, wherein the plurality of scattering foils distribute the beam of charged particles over the range of incidence angles. In some embodiments, the first particle tracking detector comprises two or more layers of charged particle detectors with each layer being perpendicular to at least one other layer and each layer including a plurality of charged particle detectors parallel to each other and structured to convert deposited energy from at least some of the charged particles into electrical current. In some embodiments, the charged particle detectors comprise scintillating fibers coupled with silicon photomultiplier sensors.

In some embodiments, the scanner further includes a second particle tracking detector located relative to the scan-volume stage and opposite to the first particle tracking detector system, where the second particle tracking detector structured to receive and measure position and direction of the charged particles before the charged particles transit though the object while allowing the charged particles to pass through, and where the second particle tracking detector is communicably coupled to the processor to send information to the processor. In some embodiments, the second particle tracking detector comprises two or more layers of charged particle detectors with each layer being perpendicular to at least one other layer and each layer including a plurality of charged particle detectors parallel to each other and structured to convert deposited energy from at least some of the charged particles into electrical current.

In some embodiments, the charged particle detectors comprise scintillating fibers coupled to silicon photomultiplier sensors. In some embodiments, the scan-volume stage is a conveyor belt. In some embodiments, the beam of charged particles include electrons. In some embodiments, the atomic number is an average atomic number of materials associated with or included in the object. In some embodiments, the calorimeter includes a scintillator coupled to a photomultiplier tube (PMT), where the scintillator is structured to converted the charged particles from the first particle tracking detector into photons, where the PMT is structured to convert the photons to electrical current, and where the energy of the charged particles received by the first particle tracking detector is based on the electrical current.

This patent document also discloses an example method of operating a scanner for interrogating contents of a volume. The example method comprises generating a beam of charged particles; distributing the beam of charged particles over a range of incidence angles and positions to enter an object to be scanned; detecting positions and directions of the charged particles that exit the object; and generating an estimate of a spatial map of the atomic number and the density of the object based on at least the positions and the directions of the charged particles that exit the object. In some embodiments, the method further includes moving the object to be scanned through the range of incidence angles and the positions of the beam of charged particles that enter the object. In some embodiments, the distributing comprises adjusting the beam of charged particles from a horizontal orientation received from a source of the beam of charged particles to a vertical orientation that enables the beam of charged particles to be directed towards the object to be scanned.

In some embodiments, the method further includes determining scatter angles of the charged particles using at least the positions and the directions of the charged particles that exit the object, wherein the atomic number and the density of the object are proportional to the scatter angles. In some embodiments, the method further includes detecting positions and directions of the beam of charged particles before the beam of charged particles enter the object, wherein the scatter angles are determined based on the positions of the beam of charged particles before the beam of charged particles enter the object and based on the positions of the charged particles that exit the object.

In some embodiments, the method further includes measuring energy of the charged particles that exit the object; determining energy loss of the charged particles based on the measured energy and an energy of the beam of charged particles that enter the object; and determining an estimate of the density of a part of the object along a path of the beam of charged particles based on the energy loss, wherein the density of the part of the object is proportional to the energy loss. In some embodiments, the beam of charged particles includes electrons. In some embodiments, the atomic number is an average atomic number of materials associated with or included in the object. In some embodiments, the spatial map is a three-dimensional (3D) reconstruction of the object.

DETAILED DESCRIPTION

This patent document discloses apparatus, systems, and methods for using a charged particle beam (e.g., beam of electrons) to interrogate a volume using charged particle attenuation and scattering tomography to screen the volume for the presence of materials of interest inside the volume. The disclosed apparatus, systems, and methods can improve three-dimensional (3D) mapping of materials within a volume by providing multiple illumination positions and angles via distribution of the incident beam.

There are several advantages of using direct-electron or other charged-particle beam tomography. For example, the scanner described in this patent document can enable better material discrimination, differentiate materials in a 3D map of the volume, yield better throughput with more highly automated threat detection, automatically detect materials of interest based on material signature library agreement, lower false alarm rates, and enable checkpoint operation with lower staffing that further reduces operational cost. Thus, the disclosed scanners can be used at checkpoint applications, such as border crossings, mass transit terminals (subways, buses, railways, ferries, etc.), and government and private-sector facilities. Further, direct-electron tomography or other charged-particle beam tomography systems and methods use less expensive detector units with no moving parts that results in lower life-cycle costs compared to X-ray tomography, thanks to much lower maintenance and repair expenses.

Figure 1:
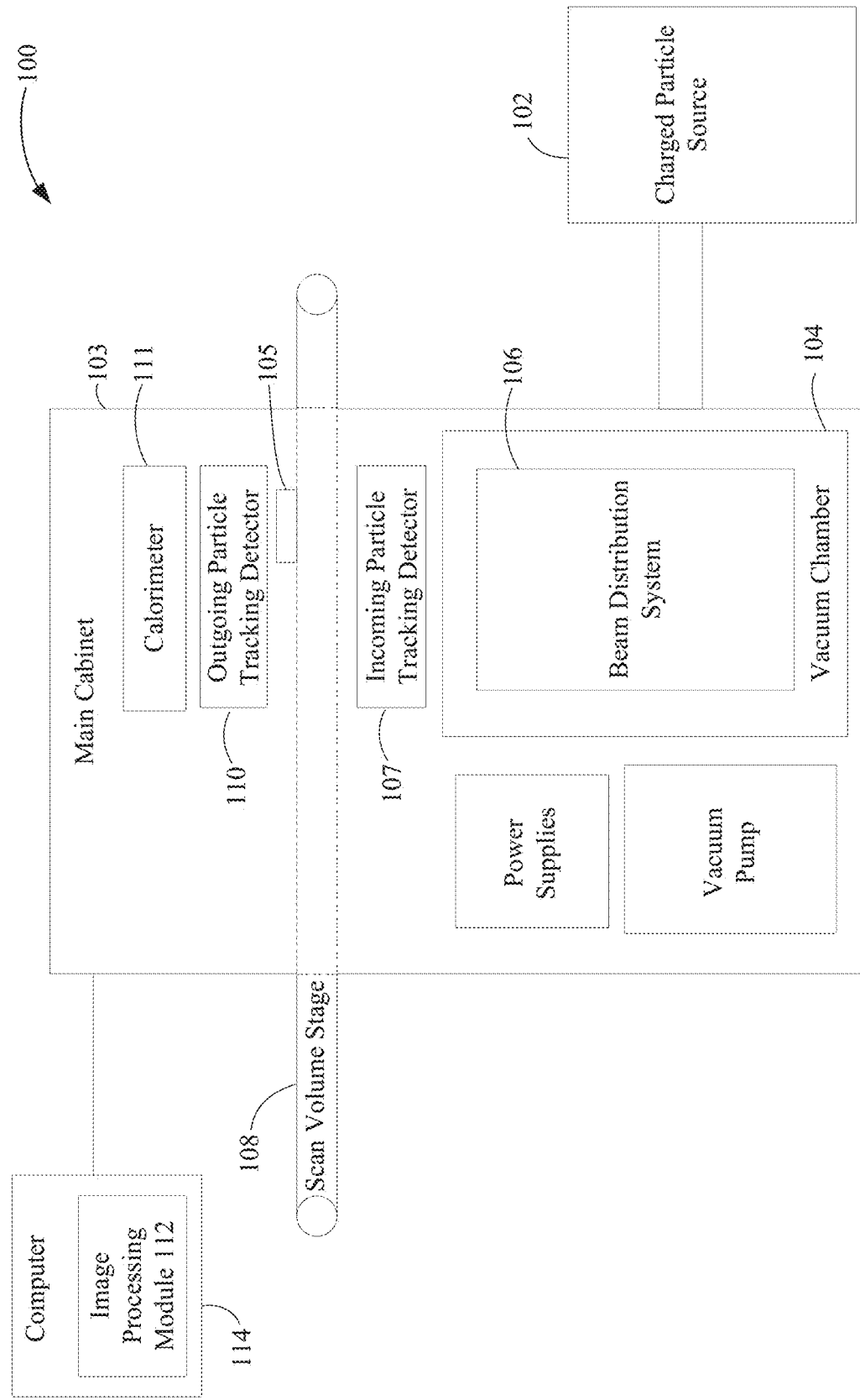
FIG. 1 illustrates an exemplary charged particle scanner.

FIG. 1 illustrates an exemplary scanner 100 that includes a charged particle source 102 that generates charged particles with which the scanner 100 can scan an object under inspection. The charged particle source 102 may use a low dose of electrons is accelerated to high energy and used as a probe of the volume in item 105. A variety of accelerators can be adapted to fulfill the electron beam current and energy requirements for the charged particle source 102. The charged particle source 102 may include a particle accelerator, such as a microtron, that can produce electrons with a nominal energy chosen based on the average characteristics of the objects being scanned. For example, an accelerator can produce electrons with 10-50 MeV for items such as mobile devices.

The charged particle source 102 may generate a single collimated pencil beam of electrons (or other charged particles) having a pre-determined energy. Thus, the charged particle source 102 can generate a direct current (DC), pencil-beam of electrons at a high enough current to provide enough electrons to reconstruct a useable image of the device under inspection within an acceptable exposure time, but not so high a current to overwhelm the incoming and/or the outgoing particle tracking detectors, 107 and 110. In some embodiments, a single charged particle source 102 can be configured or structured to provide beams of charged particles to one or more main cabinets 103.

As shown in FIG. 1, the scanner 100 includes a vacuum chamber 104 that may also include one or more vacuum pumps. The main cabinet 103 may include the vacuum pumps for the vacuum chamber 104 and power supplies for the various sub-components that are located in the main cabinet 103. A vacuum chamber 104 includes a charged particle inlet that receives the charged particles from the charged particle source 102. The charged particle beam may exit the vacuum chamber via a thin window on top of the vacuum chamber that accommodates the charged particle beam and that allows the charged particle beam to probe an object 105 placed on the scan-volume stage 108.

The vacuum chamber 104 includes a beam distribution system 106 that may be kept under vacuum because the air scatter over the beam's path length may cause an unacceptable scatter of the beam. This vacuum may not be especially hard. For example, the vacuum chamber 104 can be designed to reach vacuum pressures of $10^{-3}$-$10^{-5}$ Torr with static deflection that may not exceed 0.012 in.

The charged particles, such as electrons, are received by a beam distribution system 106 that may be housed in a vacuum chamber 104. Both the beam distribution system 106 and the vacuum chamber 104 can be housed in a main cabinet 103. The beam distribution system 106 is designed to maximize the angular and entry position distribution of the charged particles on the scan volume or scan item 105. This can be accomplished by using magnets and magnetic fields to control the trajectory of the charged particles, or by taking advantage of the stochastic scattering in multiple thin layers of material in the beam distribution stage.

Figure 2:
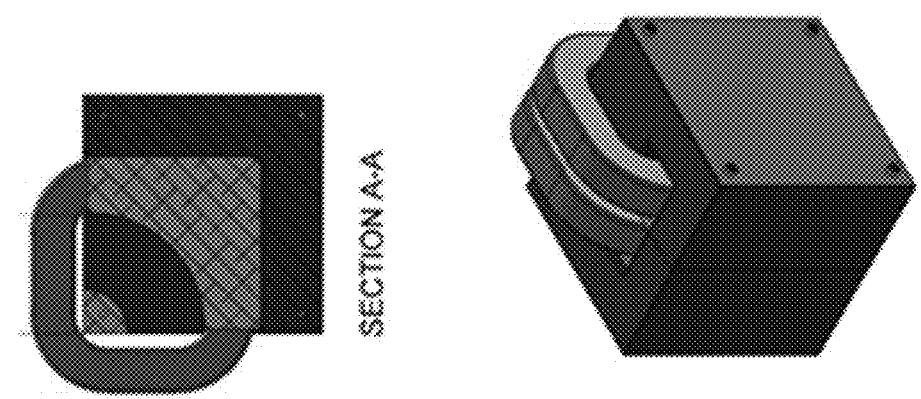
FIG. 2 shows an exemplary design for a 90 bend magnet.
Figure 2:
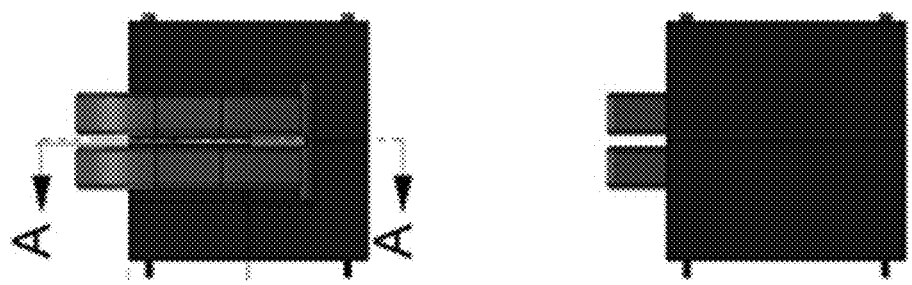

The beam distribution system 106 includes a bend magnet that can position the beam correctly by receiving the charged particle beam from the charged particle source 102 in a first orientation (e.g., horizontal) and by changing the orientation of the charged particle beam to a second different orientation (e.g., vertical). FIG. 2 show the exemplary design for a 90° bending magnet or bend magnet. In embodiments where the charged particle source is an accelerator, the electrons exit from the side of the accelerator as a horizontal pencil beam. However, since the incoming and/or outgoing particle tracking detectors, 107 and 110, are oriented vertically at a top region of the main cabinet 103 above a location where the charged particle beam enters the vacuum chamber 104 and/or beam distribution system 106, a 90° bending magnet bends the electron beam from horizontal direction to vertical direction towards the incoming and/or outgoing particle tracking detector 107 and 110.

An assembly in the beam steering system 106 that includes the bending magnet may also contain a built-in beam dump comprising a mass of aluminum. The beam dump can absorb the electron beam in the case of steering system failure, or other upstream problems. Radiation leakage from the beam dump can be monitored and connected to a safety interlock, which will shut down the charged particle source 102 in the event of any issues.

After the bending magnet orients the charged particle beam in the correct orientation, the charged particle beam passes through a series of scattering foils in the beam distribution system 106. In some embodiments, the series of scattering foils located in the beam distribution system 106 may be used to control the trajectory of the charged particles to convert the charged particle beam from a pencil beam to a wide beam or a fan beam. The series of scattering foils may receive the charged particles from a bending magnet and may distribute the charged particle beam over a range of angles and positions incident on an object to be scanned. For example, the series of scattering foils may include a first and a second scattering foil. The first scattering foil may position the beam across the object or a region of the object to be scanned, and the second scattering foil may allow the scanner to achieve angular distribution of the charged particles to provide multiple angles of illumination of the object or region of the object to be scanned. Thus, the beam distribution system 106 can be structured to distribute the beam of charged particles over a range of incidence angles and positions. The beam exits the vacuum chamber 104 via a narrow slot or a thin window at the top of the vacuum chamber 104.

FIG. 1 shows that a scan-volume stage 108 is located above a vacuum chamber 104. The scan-volume stage 108 may include a conveyor belt that can move an item 105 through a scan region where the charged particle beam exiting the beam distribution system 104 and the vacuum chamber 104 interacts with or passes through materials in the item 105. Each item may be loaded onto the conveyor belt by the user. Once on the conveyor belt, the item 105 can be moved through the charged particle beam and out to the other side. The exemplary scanner can produce a beam electron flux to probe an item 105, such as a phone. In some embodiments, a phone placed on the scan-volume stage 108 may traverse the beam for approximately 3 seconds. The time that the item 105 passes through the charged particle beam may depend on the length or width of the item 105.

In some embodiments, a scan-volume stage 108 is located in a path of the scanned beam of charged particles from the vacuum chamber 104. The scan-volume stage 108 is configured to support the item 105 to be scanned, and can optionally be configured with a translation stage, such as a conveyor belt, operable to move the object relative to the incident charged particles. In some embodiments, a method for interrogating the contents or volume of the item 105 includes moving the item 105 through the scan region to reduce the dimensionality of the beam distribution from two-dimensions across the surface of the item 105 to one-dimension in a line across the item 105 as it is translated through the scanner system. The scan-volume stage 108 may be volume sized to contain the scanned object. As a result, the dimension of the scan-volume stage may be selected based on the size of the item 105 to be scanned. For example, the width and height of the scan-volume stage may be larger than a laptop or a smartphone if the scanner 100 is designed to scan laptops or smartphones.

In some embodiments, the conveyor belt can be a 2.5" diameter powered roller, which can move a 0.09" thick belt up to 33 ft/min. In some embodiments, the conveyor may move continuously so that items 105, such as phones, can be dropped in place on the conveyer and can move through the system at a constant rate. It may also be desirable to move the item under inspection more dynamically through the scanner 100. On entry the item might move slowly through a positioning system (e.g., bumpers) that center the phone in the scan volume. On exit, the scanner might sequester the phone until processing is finished—allowing operators to easily confiscate or further interrogate the phone. Delay on exit would also allow an option to re-scan; run the device back through the scan volume in cases of system error or the need for further investigation.

The scanner 100 in FIG. 1 includes an incoming particle tracking detector 107 and an outgoing particle tracking detector 110. An outgoing particle tracking detector 110 is located above the scan-volume stage 108. An outgoing particle tracking detector 110 can measure the deflection (scattering) and absorption (stopping) of electrons that exit or that are absorbed in an item 105 under inspection. The data related to the measured deflection (e.g., position of outgoing charged particles) and data related to absorption of the outgoing charged particles can be provided by the outgoing particle tracking detector 110 to an image processing module 112 of the computer 114. The image processing module 112 can combine data associated with electron scattering/stopping with data associated with energy loss determined by the calorimeter 111, as discussed below, to construct an image or a map of the atomic number and density of the item 105 under inspection and its contents.

Scattering is a random process and building up an image requires the image processing module 112 to analyze the paths of many electrons through the item 105. The combined data approach of using the calorimeter 111 with any one or both of the particle tracking detectors, 107 and 110, can allow the exemplary scanner 100 to measure density and atomic number of materials within the item 105, where Z may represent the average atomic number of the materials in a given volume. This approach can improve the ability of the exemplary scanner 100 to classify materials in a manner less dependent on the physical way in which the material in the item 105 is packed. A display 116 connected to a computer 114 can show spatial maps of the effective density of material in the item 105 and the effective atomic number of the item 105. The display 116 can be a touch screen display that may be mounted on a moveable arm.

In some embodiment, the scanner 100 can also include an incoming particle tracking detector 107 that can be located between the beam distribution system 106 and the scan-volume stage 108. The incoming particle tracking detector 107 can also be provide position data associated with the incoming charged particles to the image processing module 112 of the computer 114. Both the incoming and the outgoing particle tracking detectors, 107 and 110, may include two scatter detector planes. Each plane of the scatter detector can measure the xy position of each electron passing through the scatter detector. For the outgoing particle tracking detector 110, the combination of the two planes can allow the outgoing particle tracking detector 110 to measure the exit position and trajectory (or direction) of each electron exiting the item 105 that is scanned.

As the charged particles travel through an item 105 on the scanner 100, their trajectories are altered due to the interaction with the matter in an item. A high energy electron in scanner 100 may undergo multiple Coulomb scatterings while traversing the item, the aggregate scattering angle is a function of the density and atomic number, Z, of the materials inside the item.

In an exemplary embodiment, an aggregate scattering angle of an electron can be calculated by the image processing module 112 by measuring the trajectory of the electron before it enters and after it travels through a volume of interest by using the data provided by the incoming and the outgoing particle tracking detectors 107 and 110. By accumulating multiple particle tracks from measurement of trajectories of electrons before and after the electrons travel through a volume of interest, the image processing module 112 can build a 3D image of the item 105 with a reconstruction algorithm. In an exemplary embodiment, the incoming particle tracking detector 107 can determine the trajectory of the electron, before it travels through a volume of interest. In another exemplary embodiment, the outgoing particle tracking detector 110 can determine the trajectory of the electron, after it travels through a volume of interest, eliminating the need for a tracking detector to measure the electron trajectory prior to entering the inspection volume. In some embodiments, both the incoming and the outgoing particle tracking detectors may be used.

In an exemplary embodiment, the scatter detector of the incoming and outgoing particle tracking detector 107 and 110 include detector channels, where each detector channel can include a scintillating fiber. The scintillating fiber converts a small fraction of the energy from the electrons into photons. Because the scintillating fibers of the two scatter detector planes have a low areal density (density times the thickness of the material), allowing the electrons to pass through without significant deflection or attenuation, the electrons can reach the object under test and the calorimeter. The scintillating fibers can be coupled to silicon photomultipliers (SiPMs) which convert the photons into current.

Figure 5:
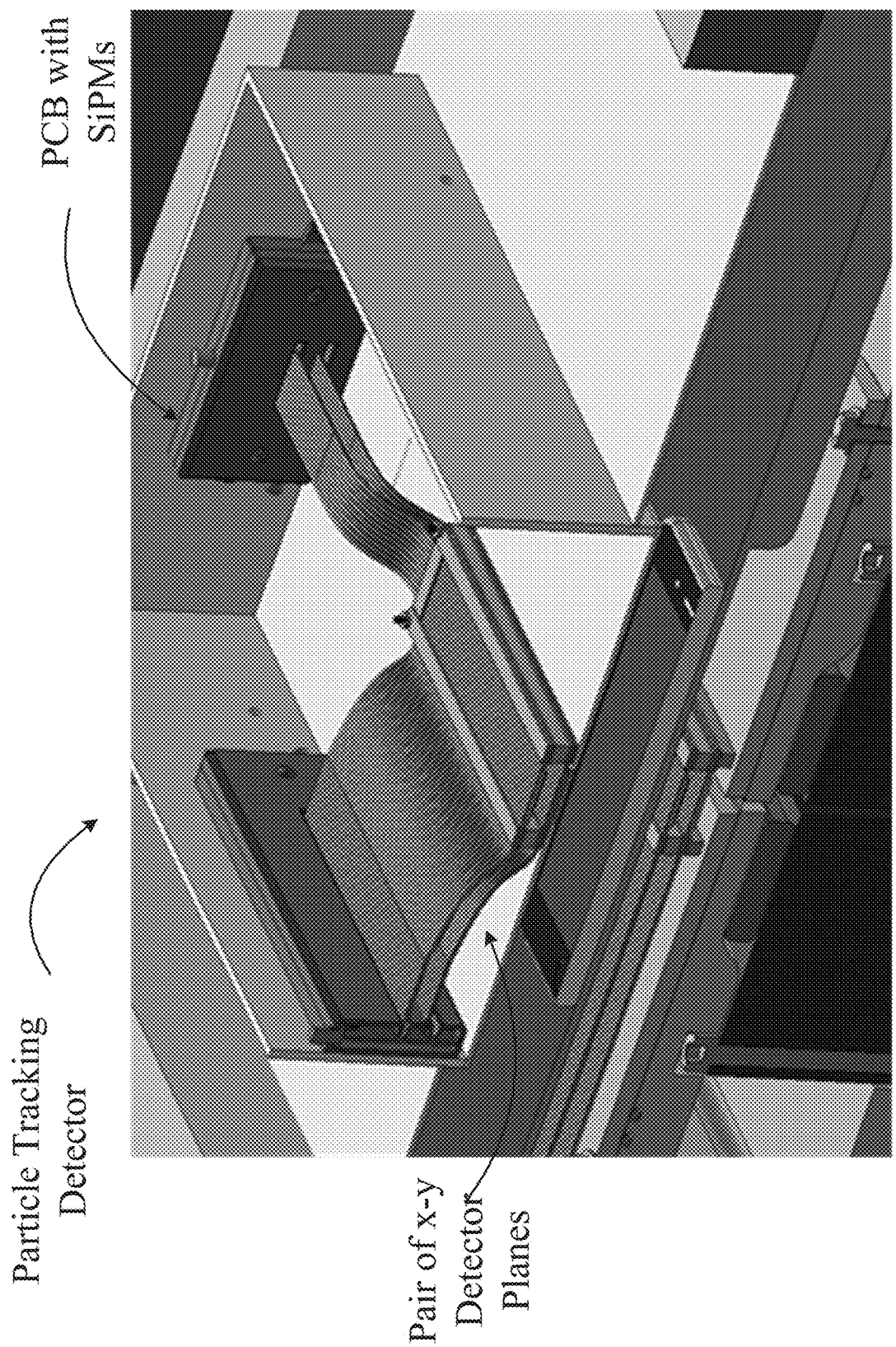
FIG. 5 shows an exemplary outgoing particle tracking detector, where each fiber of the outgoing particle tracking detector can be coupled to a silicon photomultiplier (SiPM).
Figure 7:
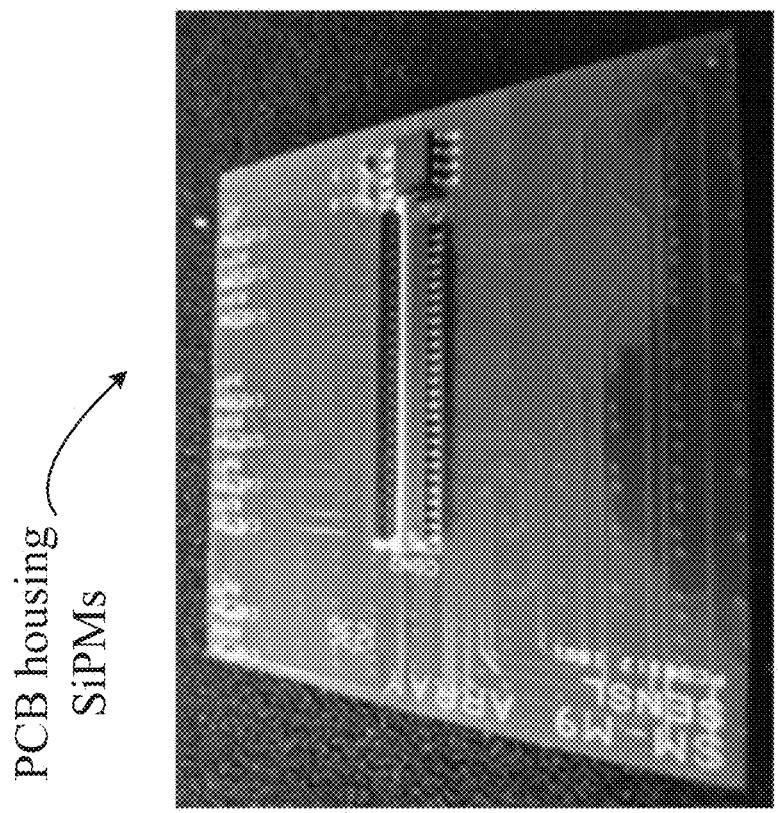
FIG. 7 show an exemplary printed circuit board (PCB) with SiPM.
Figure 7:
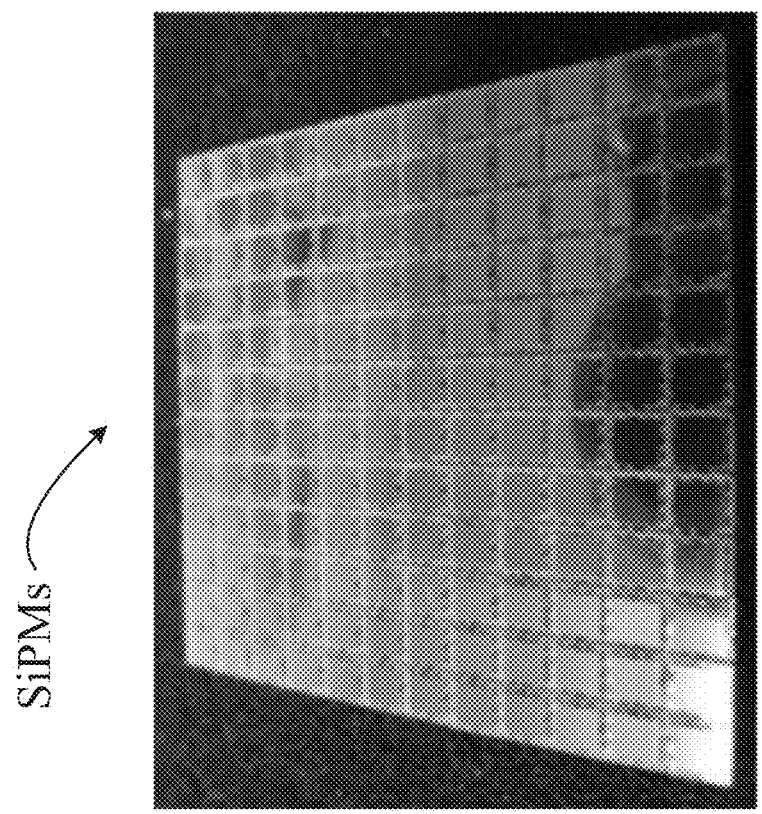

The current can be read out, as a voltage, through low voltage differential signaling (LVDS) at a signal processing unit, such as an FPGA based data acquisition system or data acquisition card (shown as data acquisition module in FIG. 10), which may be located in the computer 114. The SiPMs can be located at one end of the fibers outside the scan volume. In an exemplary embodiment, the SiPMs can be small surface mount chips, 1.5 mm square, with a 1 mm sensitive area on the face of the chip. The SiPMs can be mounted as a grid array, with shared power bias voltage applied to the cathodes. FIGS. 5 and 7 show an example of such a grid and the PCB which would house it.

In some embodiments, a single particle tracking detector (e.g., either 107 or 110) can comprise two x-y planes, four layers total. Scintillating fibers included in a layer can be parallel to each other and the orientation of one set of fibers in one layer can be perpendicular to the orientation of another set of fibers in another layer. One benefit of two x-y plane fibers is that it can measure both position and direction of the charged particles in the scatter detector. The scattering of the particles takes place in two dimensions. One benefit of having one layer perpendicular to another layer is to allow the scatter detector to measure the scattering in two dimensions to maximize the information extracted. Two scatter detectors 107 and 110 could be used for the system: one detector 107 to measure the trajectory of the incoming particle (before reaching the item) and another detector 110 to measure the outgoing trajectory. The scatter detector layers can measure the position and direction of exiting electrons (or other charged particles) to determine the electron scattering on the path through the item being scanned.

Figure 3:
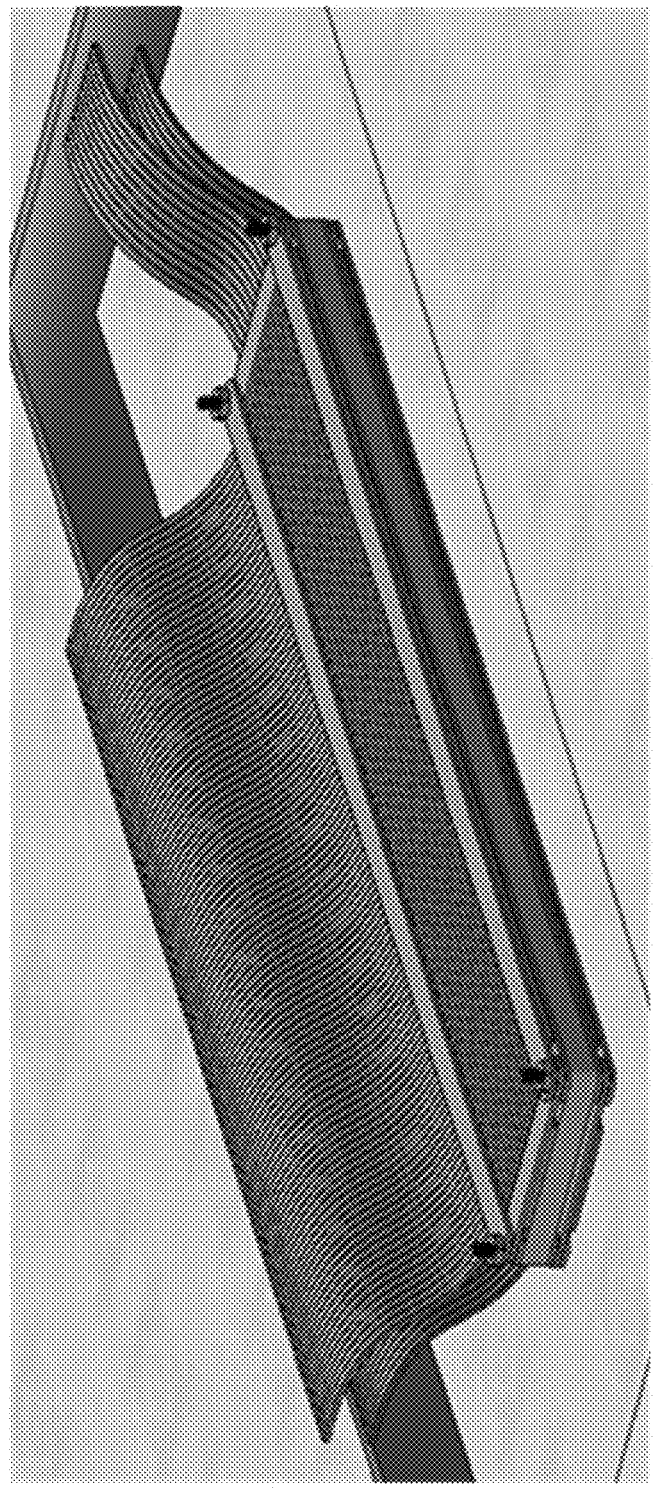
FIG. 3 shows an exemplary model of a detector plane for the particle tracking detectors.

In one embodiment, the scatter detector can be made from commercially available scintillating fibers. Spatial resolution in particle trajectory fitting can be determined by fiber cross sectional area. The detector geometry can be 200 mm×20 mm to accommodate the beam exiting from the beam distribution system. FIG. 3 shows an exemplary model of a single detector plane that can be 200 mm×20 mm, 4 layers, two along x and two along y. In another embodiment, the charged particle detector can be made from solid-state silicon microstrip detector arrays.

Figure 4:
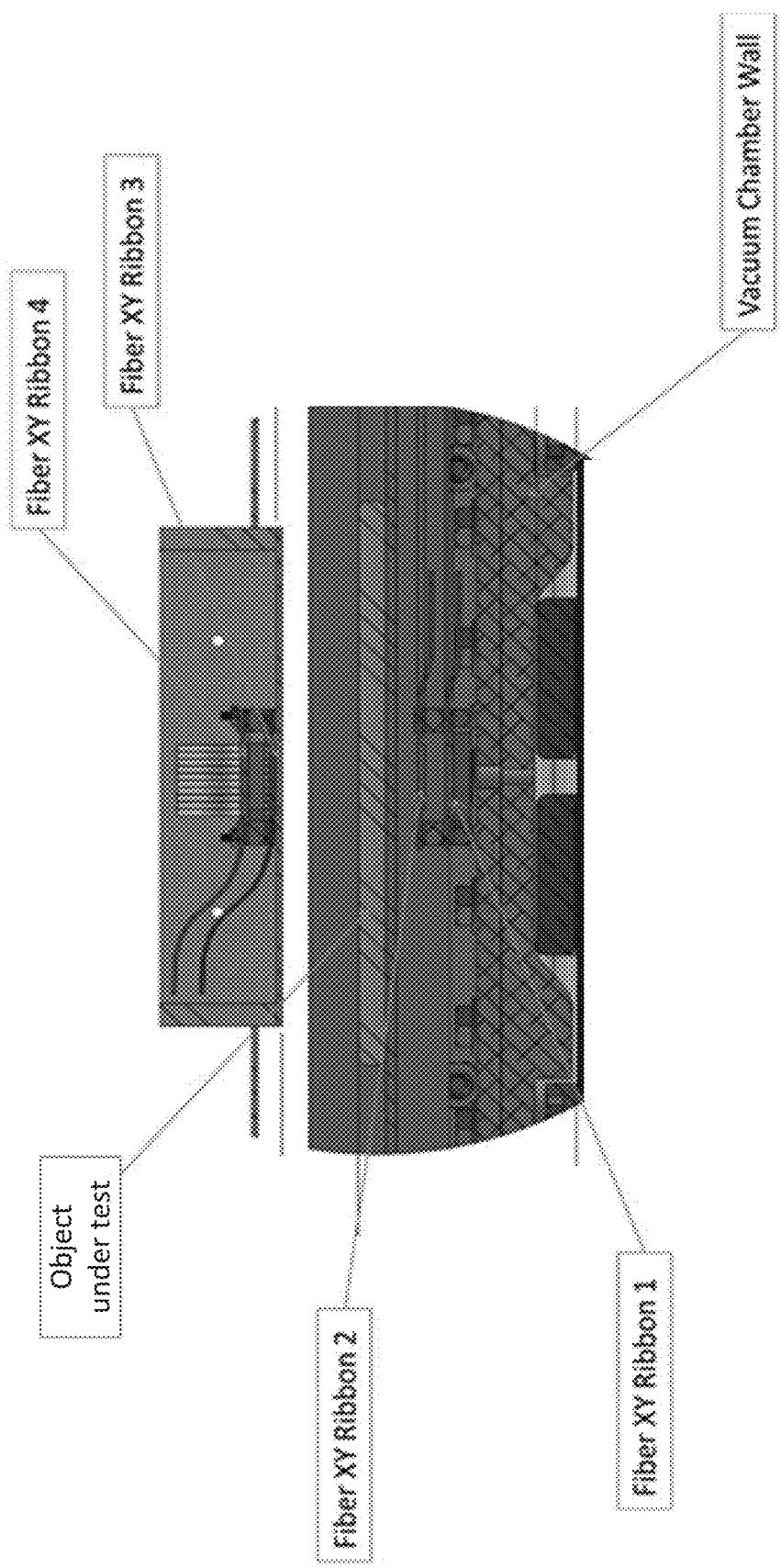
FIG. 4 shows a side view of the exemplary scanner that includes the particle tracking detectors and a vacuum chamber.

FIG. 4 shows a side view of the scanner, including the exemplary particle tracking detectors and the vacuum chamber. The incoming particle tracking detector is shown with "Fiber XY Ribbon 1" and "Fiber XY Ribbon 2," and the outgoing particle tracking detector is shown with "Fiber XY Ribbon 3" and "Fiber XY Ribbon 4." Each detector module can be several mm thick in total, and has two x-y planes that can be separated by a few millimeters (mm). The separation of x-y planes is needed to solve $$\frac{dx}{dz} \text{ and } \frac{dy}{dz}.$$

Figure 6:
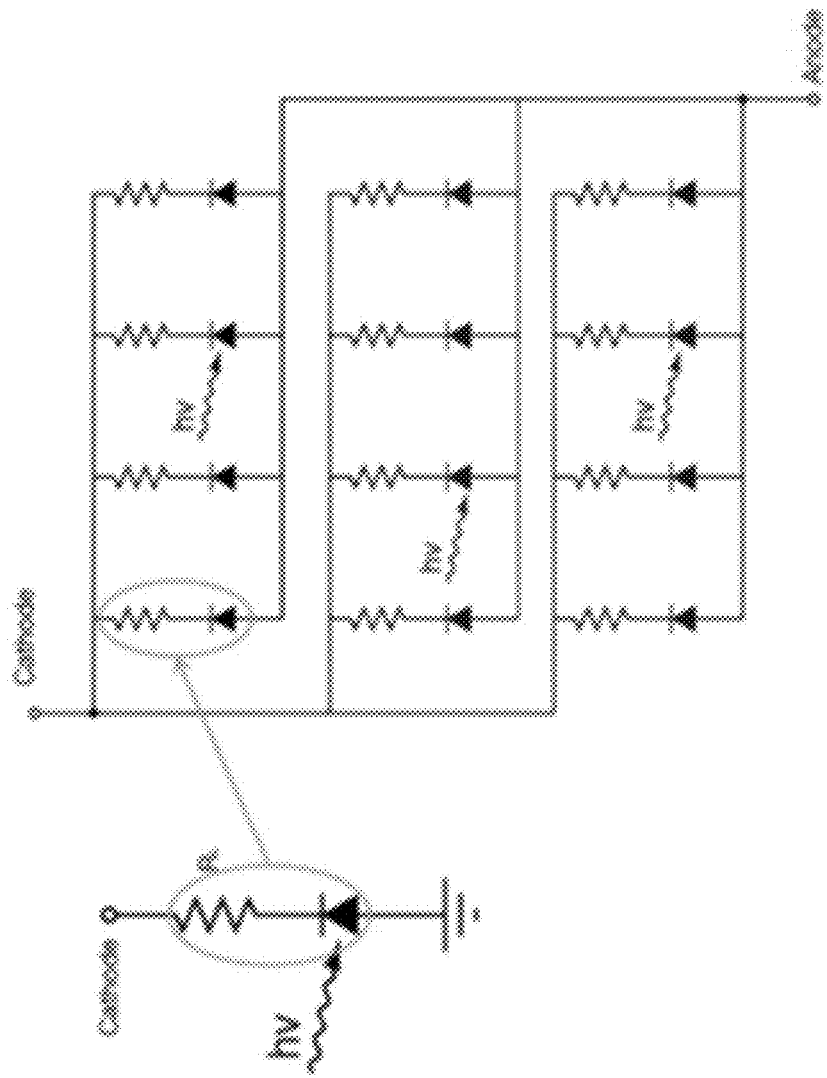
FIG. 6 shows an exemplary schematic of the microcells in a SiPM.

FIG. 5 shows an exemplary scatter detector planes of the outgoing particle tracking detector, where each fiber of each scatter detector plane of the outgoing particle detector can be coupled to a silicon photomultiplier (SiPM). Each SiPM can be an array of avalanche photodiodes (APD) in series with a quench resistor. Collectively the APD and quenching resistor are called a microcell. The SiPMs (and therefore, all or a plurality of microcells) can be biased at a few tens of volts DC. A photon incident on a single microcell causes a breakdown of the internal field inside the photodiode and a rush current ensues. The quenching resistor converts that current to voltage and quells the current rush until the diode's internal field is restored. Multiple microcells increase dynamic range, allowing the SiPM to measure hundreds to thousands of photons simultaneously (depending on the particulars of the microcell). FIG. 6 shows an exemplary schematic of the microcells in a SiPM. Bias voltage can be applied to the cathode and readout can be made at the anode. The fibers of the incoming particle tracking detector can be similarly coupled to a PCB with SiPMs as discussed for the outgoing particle tracking detector.

Figure 8:
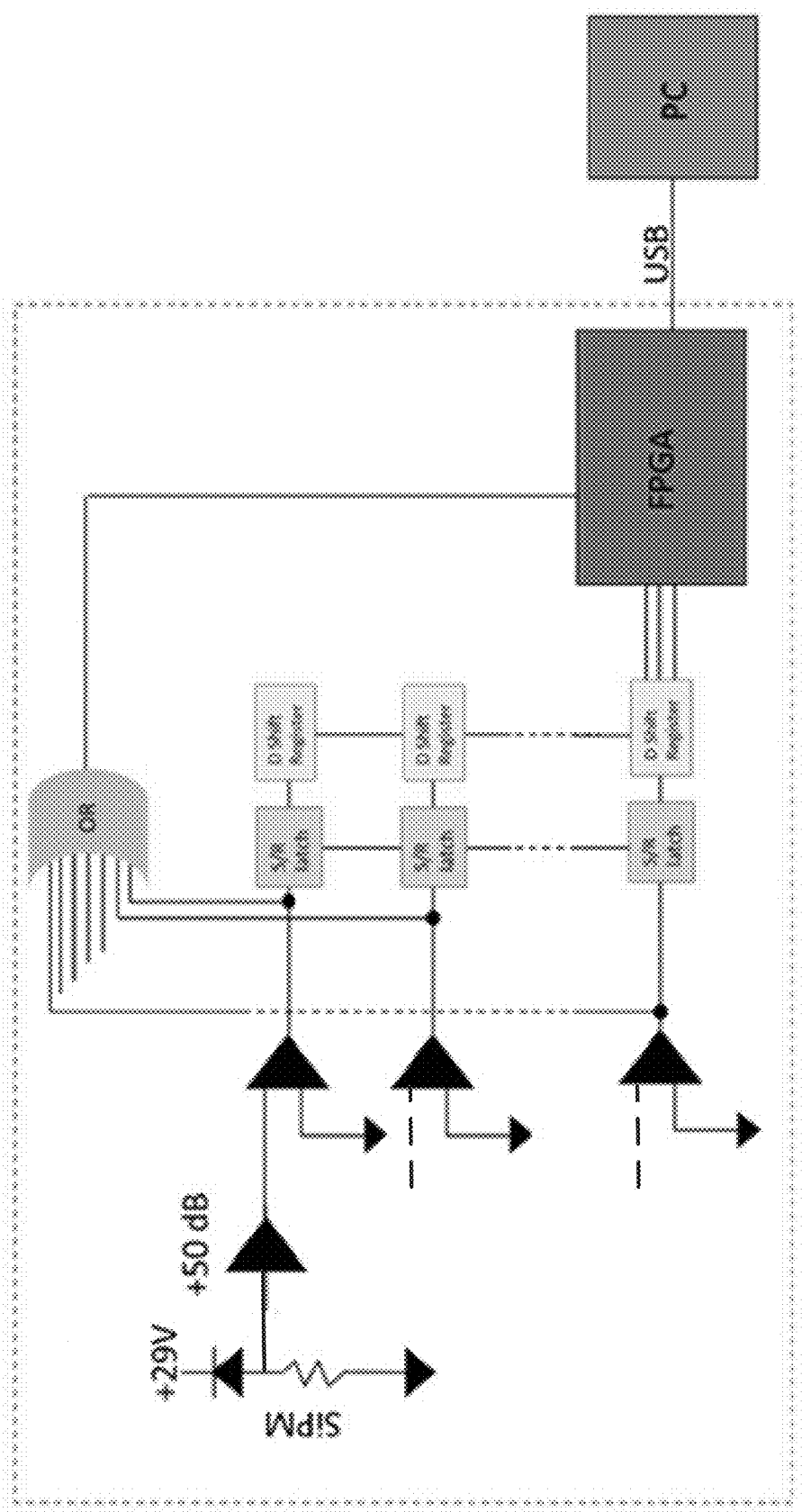
FIG. 8 shows the exemplary schematic used for each of the incoming and the outgoing particle tracking detectors.

FIG. 8 shows the exemplary schematic used for each of the incoming and the outgoing particle tracking detectors, 107 and 110, minus the scintillating fiber. Readout from each channel can be achieved with a simple comparator circuit.

As an electron moves through the exemplary 8 total layers of x and y detectors, the fibers will respond to the hits by producing light pulses, which in turn are converted into electrical current by the SiPMs. Each current pulse drives the voltage at the comparator over a threshold, which subsequently produces a digital output. The processing algorithm looks for the fibers the particle has traversed and the incoming and outgoing tracks can be calculated.

A challenge of the exemplary detector is signal to noise ratio (SNR) in the fiber/SiPM system. The number of photons produced in a 1 mm fiber, by a near relativistic electron, is relatively small and on par with the signal level of the dark current events in the SiPM, e.g., the SNR can be about 1. In one embodiment, requiring coincidence between tracking layers can eliminate many false hits, thus reducing the required SNR. Additionally, the low SNR can be mitigated from two approaches: lower the noise and increase the signal. It is possible to achieve the first through simple cooling of the SiPM sensor. The signal can also be increased with two measures. Improved optical claddings are being implemented by fiber manufacturers, with consequent benefits to photon efficiency. Other optical means can also nearly double light collection efficiency. In one embodiment, these measures can increase SNR to at least 3-4, and when combined with coincidence tracking in the fitting algorithm, can be sufficient to eliminate all or most of the erroneous dark events from the measurement.

FIG. 1 shows a calorimeter 111 that may be located above both the scan-volume stage 108 and the outgoing particle tracking detector 110. A calorimeter 111 can measure the energy of the exiting charged particles, which in turn will be used to determine the energy lost by the charged particles as it traversed the object being scanned. The charged particles of a pre-determined energy can be provided by the charged particle source 102. The calorimeter 111 can provide data related to energy of the charged particles that exit the item 105 to the image processing module 112 of the computer 114. The image processing module 112 can determine energy loss of the charged particles by subtracting the energy of the charged particles that exit the item from the pre-determined energy of the charged particles generated by the charged particle source 102.

In some embodiments, the calorimeter may include a magnetic spectrometer that measures the energy of the charged particles exiting an object. The magnetic spectrometer applies a magnetic field that the particles traverse. The exiting charged particles are deflected as they go through the magnetic field of the magnetic spectrometer. When a charged particle enters a constant magnetic field at right angles to its path, the charged particle is deflected into a circular path of radius r, due to Lorentz force. The magnitude of the radius r depends on the energy of the particle. An exemplary calorimeter may include a scintillator to convert the deflected exiting charged particles to photons. An exemplary calorimeter may also include a photomultiplier tube (PMT) that may be optically coupled to the scintillator. The PMT convert the photons from the scintillator to electrical current to measure the deflections of the exciting charged particles that may pass through the magnetic spectrometer. The PMT may be coupled to a processing circuitry to measure the deflections of the charged particles to measure the energy.

In an exemplary embodiment, after the electrons pass through the incoming and/or outgoing particle tracking detectors they enter the calorimeter, which absorbs and measures the energy of the outgoing electrons. This provides complementary information to the electron-scatter signal.

One of the benefits of the calorimeter is that the energy absorbed by the calorimeter reduces the radiation shielding requirements.

As a charged particle travels through matter, it loses energy predominately by interaction with the atomic electrons within the material. This energy loss is approximately proportional simply to the effective thickness of electron cloud traversed through the item 105. Because the charge of these atomic electrons is balanced by an equal number of protons in the atomic nuclei, and because in most cases the number of protons in an atomic nucleus is approximately equal to the number of neutrons, the thickness of electron cloud traversed is roughly proportional to the mass density of material traversed through the item 105. Hydrogen atoms are the exception to this, as they do not have a neutron in the nucleus. They will therefore have twice the number of electrons per unit mass.

The exemplary accelerator provides electrons with a small energy spread centered around a known or pre-determined energy. By measuring the energy of the electrons when the electrons have exited the object under test, the material density traversed by those electrons can be estimated. This is complementary to the scattering signal which increases with both the density of the material traversed and the average atomic number of the atoms within this material. In other words, energy loss is proportional to density while scattering angle is proportional to both density and atomic number. Therefore, energy loss provides complementary information to scattering.

As electrons traverse a material some of the electron's kinetic energy will be converted to bremsstrahlung X-ray photons. These photons are more penetrating and harder to stop than the electrons, and represent an escape of some fraction of the electron's energy that we wish to measure. They also increase the amount of shielding required to keep the radiation dose within acceptable levels.

Figure 9:
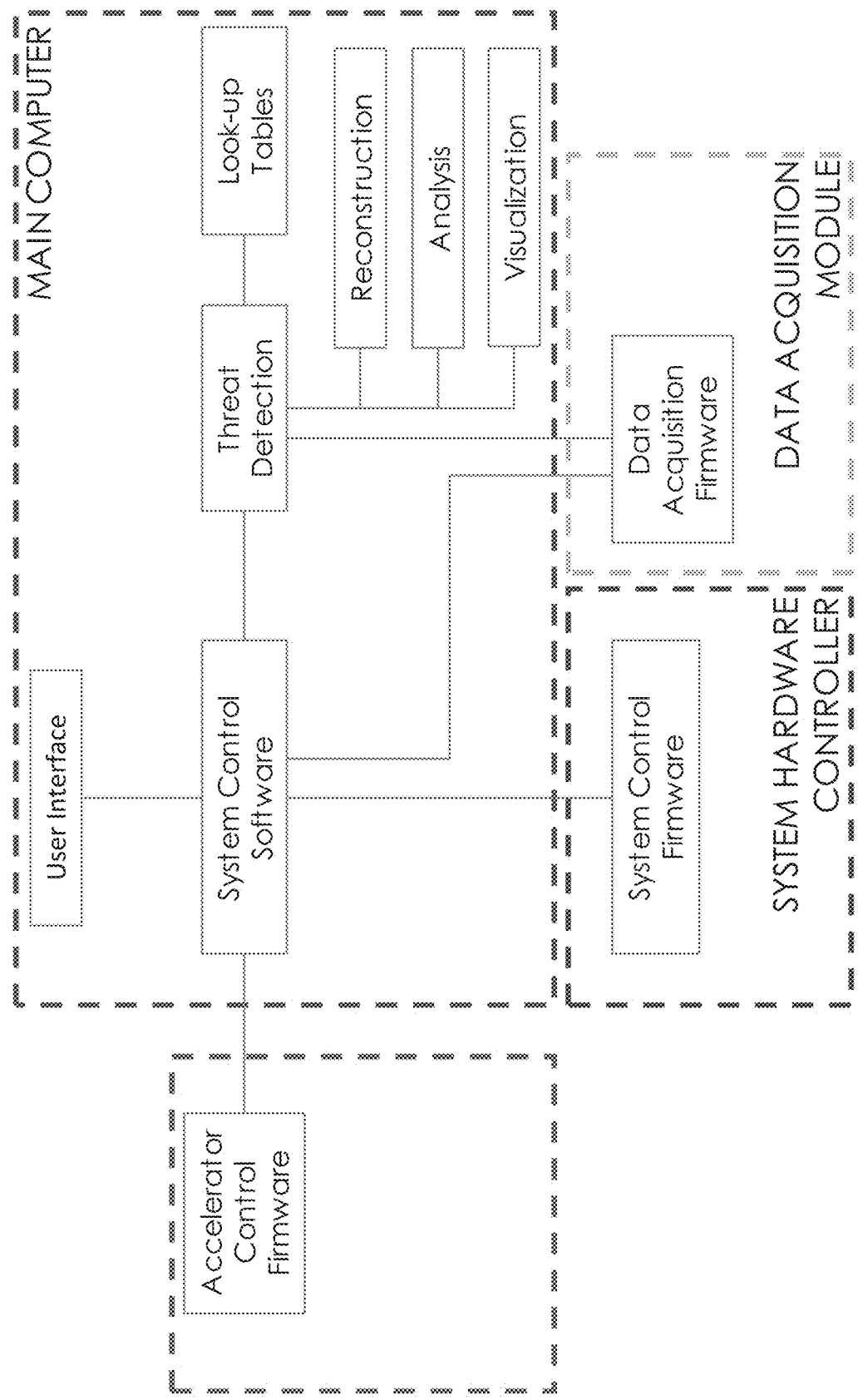
FIG. 9 shows an exemplary software architecture for the scanner.
Figure 10:
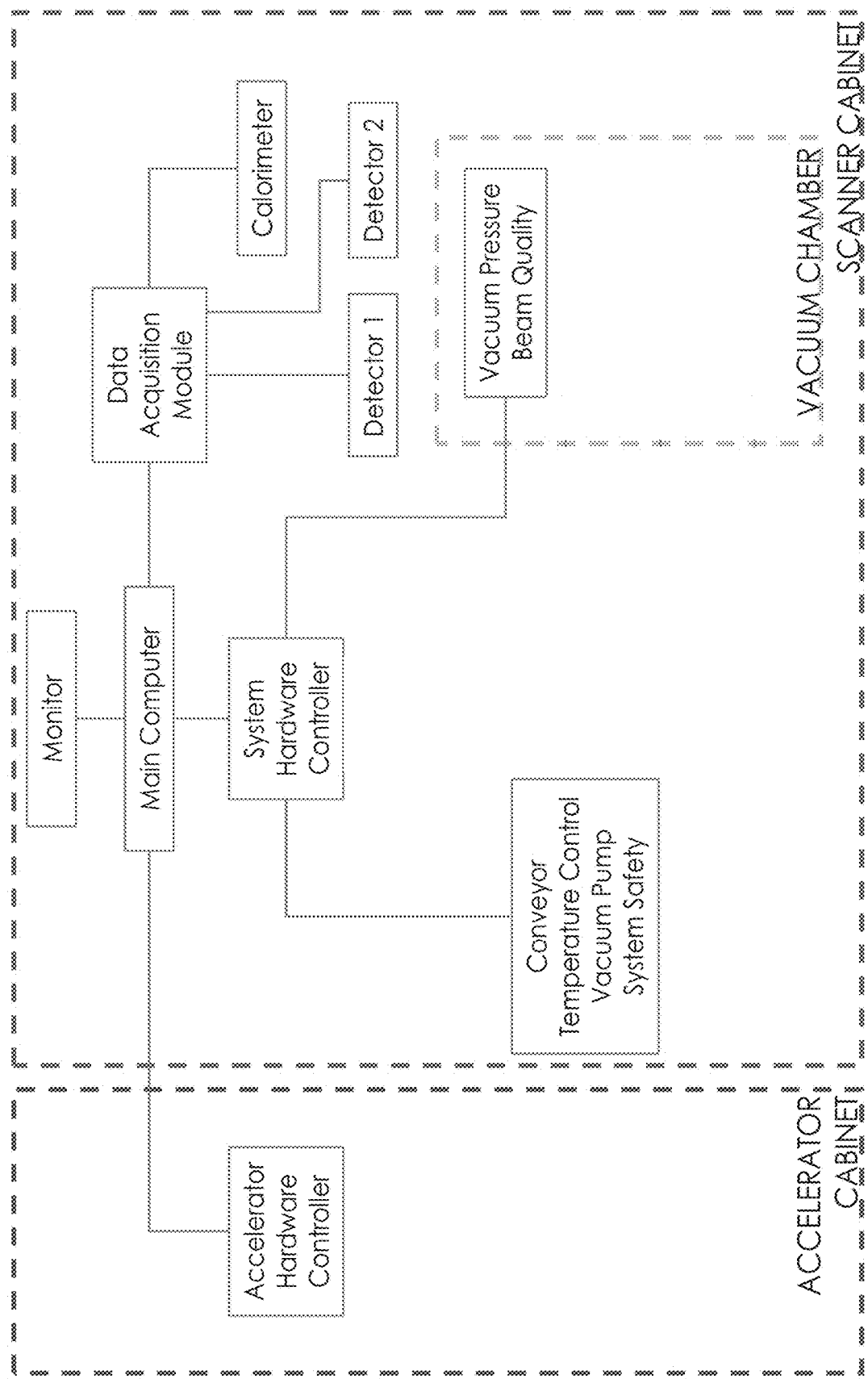
FIG. 10 shows an exemplary block diagram for the scanner.

In an exemplary embodiment, the scanner 100 includes a computer 114 that can run the exemplary software based on the exemplary algorithms and methods. FIGS. 9-10 shows the exemplary software architecture and block diagram for the scanner. The computer 114 is shown as main computer in FIGS. 9 and 10 that manages the operation of the accelerator, the beam distribution system, and optionally the conveyor belt if a dynamic transit mode is used. The image processing module 112 of the computer 114 can also handle the data stream from the incoming and/or outgoing particle tracking detectors (shown as Detector 1 and Detector 2 in FIG. 10) and from the calorimeter, and perform imaging reconstruction and analysis based on the data stream. In some embodiments, the image processing module can obtain the data stream from a data acquisition system shown in FIG. 10 that can obtain data from incoming and/or outgoing particle tracking detectors and from the calorimeter.

The exemplary scanner throughput specification can be 120 scans per hour. That allows about 30 s per phone. Placement and transit of the phone will likely take 3-5 s. The active scan time can be 3 s. That leaves a budget of ~20 s for processing and exit transport that can occur simultaneously.

In some embodiments, the data stream can contain data related to tracks for approximately 10 million electrons. The primary reconstruction algorithm can be based on a maximum likelihood expectation maximization (MLEM) method. The reconstruction algorithm can provide a quantitative measure of material density and atomic number, by virtue of taking into account not just the aggregate scattering angle of a track, but also its lateral displacement. An MLEM reconstruction can be implemented with GPU-based code. A single iteration of the algorithm, for a data set of this size, can execute in approximately 0.8 s. Five iterations should be sufficient to make an actionable image of the phone, which would consume 4 s of time. With 3 s active scan time, and 4 s processing time, there can be ample time left for longer scans, more iterations in the MLEM reconstruction, and/or rescanning the phone. There is also time to execute other image reconstruction algorithms that might yield improved detection capabilities.

Reconstruction time will likely be shortened by advances in computing and GPUs. Multiple computers/GPUs could also be run in parallel to further speed the processing. It may also be desirable to include other processing algorithms in the scanner analysis package.

While many algorithms are not as quantitative as MLEM, some show promise for greater contrast between area of threat and areas of non-threat. Threat detection using image-based detection is theoretically not as desirable as the absolute quantitation method, but can be practical to achieve the scanner purpose of reliable threat detection.

In an exemplary embodiment, the threat detection can distinguish phone batteries from threat objects, which can be very close in density but have different average atomic numbers, or vice-versa. The calorimeter and combined scatter/energy loss algorithms dramatically improve material discrimination over the use of either independently.

In an exemplary embodiment, differentiating threats from normal phones can be aided by building a look up table of known phone models. As the system scans a phone, it can look for characteristic markers which match previously scanned phones. As a particular object is scanned, over and over, its look-up table (LUT) entry can be refined over time. For example, if the scanned object is a phone that matches characteristics of a phone from the LUT, but has marked differences, that may indicate the potential of a threat. In addition, as new electronic device models are released, and scanned by the system, the LUT will expand its library.

To scan an item, the item can be imaged in slices, where each slice may be formed by irradiating the item along a single entry line across the item. Translation of the item through the scan region can build up 3D reconstruction of the item. In some embodiments, measurement of the scatter angle on each electron trajectory yields an estimate of the density and Z on that path through the item. Measurement of the energy loss yields an estimate of the density along that trajectory. The two measurements of density and Z over multiple trajectories can be combined to separately estimate the average Z and density in a 3D reconstructed voxelized map of the item. A reconstructed map can be shown on a display 116.

Unlike X-ray computed tomography, where the individual measurements are strictly attenuation measurements through the target on a line of sight between the X-ray source and the detector, with the charged-particle, e.g. electron, scattering measurements the path of the particles is not a straight line. The electrons in the beam undergo multiple Coulomb scatterings on their passage through the target and the beam can scatter into a progressively wider cross-sectional profile as it progresses. For at least this reason, the "slice" in the electron system broadens towards the exit position. The image reconstruction can take account of these scattering probabilities in the reconstruction of the 3D volume of the target.

Further, in one exemplary embodiment, modeling shows that electrons with energies ranging from 10-50 MeV can provide scattering and attenuation data when aimed through an object under inspection. Scattering and attenuation can be processed to yield and display three-dimensional maps of the effective density of material and the effective atomic number, enabling sensitive material discrimination based on the signature library. Applications to screen other objects may require different mean beam energies. Generally, the thicker the object being screened, the higher the required energy.

In an exemplary embodiment, the item 105 under inspection can traverse the system in 1 mm steps, completing a traverse of 150 mm, for example, in 3 seconds. This is a step rate of 50 Hz in one embodiment. The traversal can be in a direction perpendicular to the plane of the charged particle beam distributed by the beam distribution system.

Charged-particle beam tomography provides better material discrimination compared to X-ray technology. Unlike X-ray technology, electron beam or other charged-particle beam tomography can measure both the material's density and its average atomic number. These two independent parameters enable a more robust material characterization and classification, with a correspondingly smaller percentage of items requiring secondary screening. A benefit of the technology disclosed in this patent document is that it can significantly reduce staffing requirements. Furthermore, in contrast to the moving gantry used in X-ray tomography systems, the exemplary embodiments disclosed herein presents a low-cost means of distributing the electron beam to provide multiple angles of illumination without the use of moving parts. The absence of moving parts in the charged particle tomography apparatus enormously reduces maintenance and repair expenses, reducing life-cycle costs compared to X-ray tomography.

The charged-particle tomography disclosed in the exemplary embodiments is also contrasted with systems that rely on naturally occurring cosmic radiation for illumination rather than a controlled incident beam. Since cosmic rays arrive from different directions, they effectively provide multiple-angle illumination. However, their flux is far too low for rapid, high-resolution imaging of small objects. Furthermore, the variable trajectories of the incident particles require tracking them as they both enter and exit the volume of interest, increasing the cost of detector arrays. Because the charged particles are scattered as they pass through the volume of interest, their tracks are not straight lines, and processing can estimate the location of their effective scattering points. Thus, in principle, a single illumination direction can itself suffice for 3D imaging—in contrast to X-ray tomography, where the photons travel exclusively in straight lines.

In some embodiment, the order of the various components of the exemplary scanner can be reversed so that the beam can enter the beam distribution system from the upper portion of the main cabinet 103 and the adjusted beam exits the vacuum chamber 104 located above the scan-volume stage 108 to scan an object on the scan-volume stage 108 and to reach the calorimeter 111.

Figure 11A:
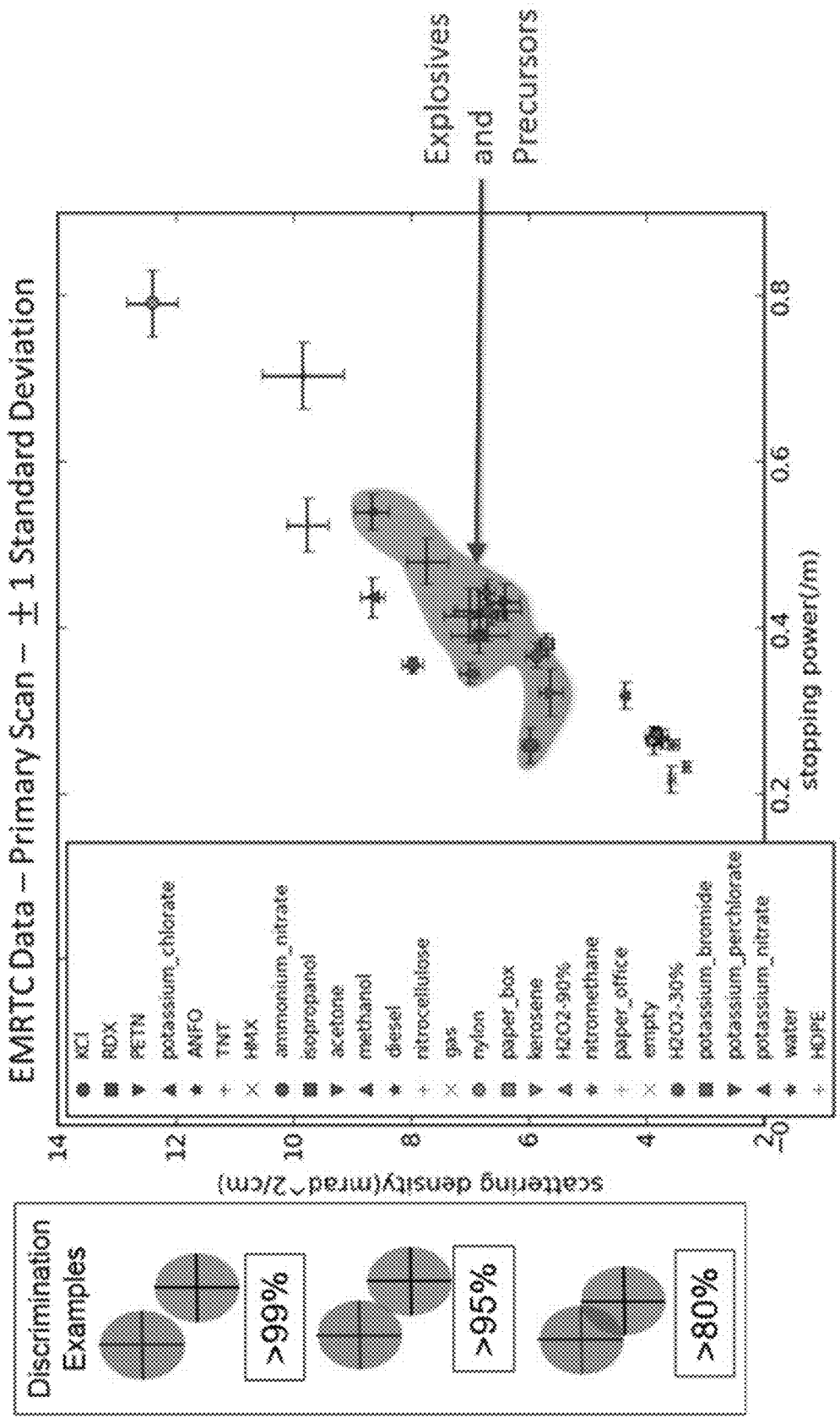
FIGS. 11A-11B illustrate the discrimination of materials based on scattering and attenuation of charged particles.
Figure 11B:
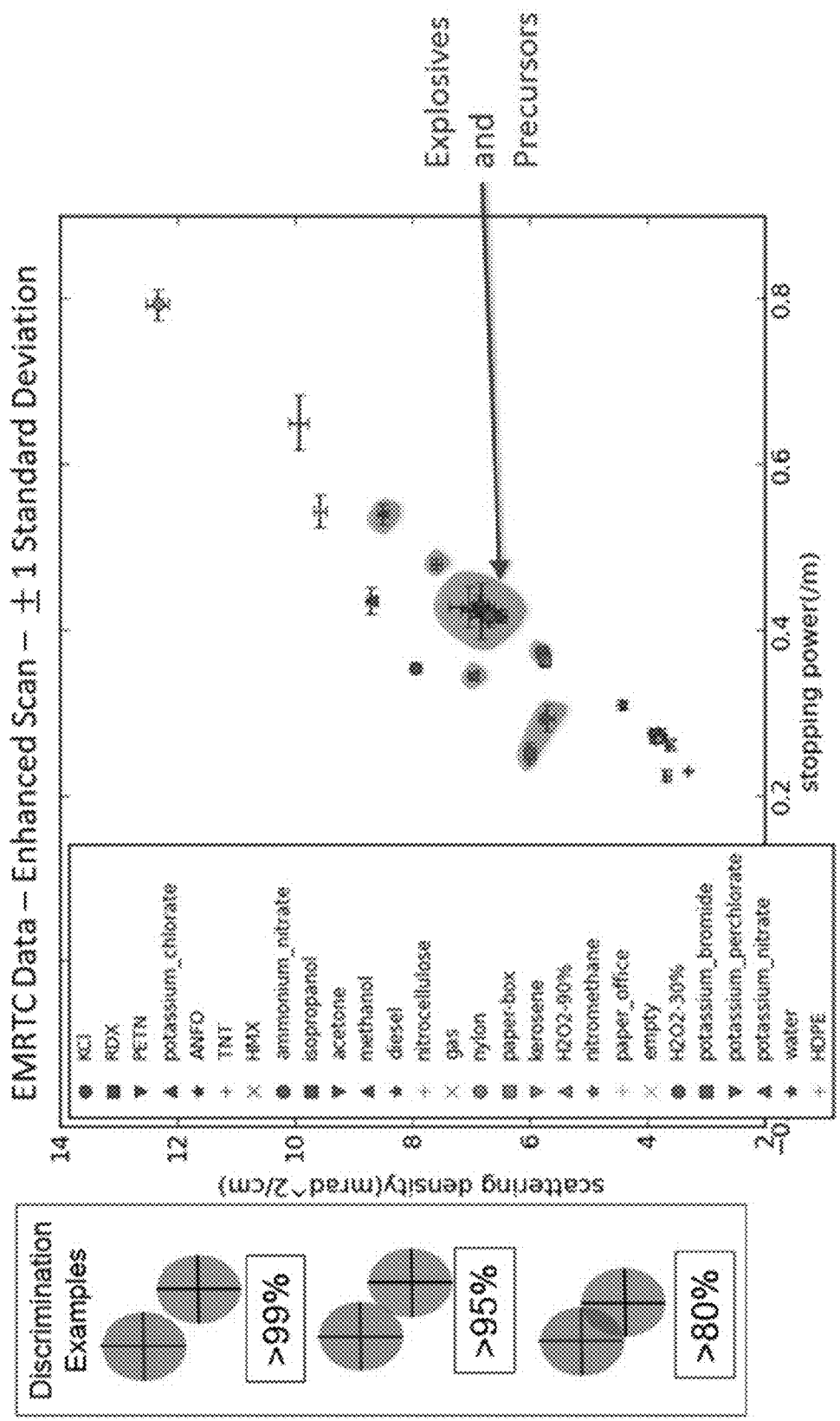

FIG. 11A-11B show plots of scattering density in the vertical axis against particle stopping power for a variety of benign and threat materials, showing the ability to discriminate them. The plot in FIG. 11A is the result of a short primary scan. The plot in FIG. 11B is a result of a longer scan duration yielding smaller error bars and, thus better material discrimination.

Figure 12:
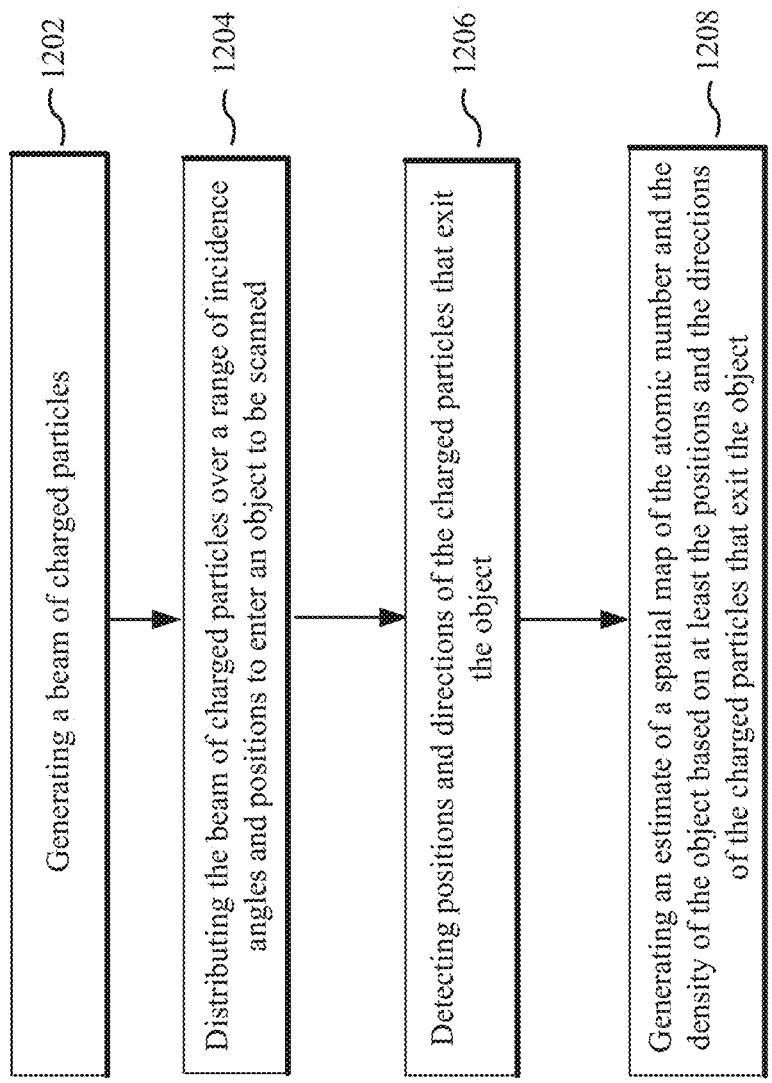
FIG. 12 shows an example flowchart of a method of operating a scanner for interrogating contents of a volume.

FIG. 12 shows an example flowchart of a method of operating a scanner for interrogating contents of a volume. Operation 1202 includes generating a beam of charged particles. Operation 1204 includes distributing the beam of charged particles over a range of incidence angles and positions to enter an object to be scanned. Operation 1206 includes detecting positions and directions of the charged particles that exit the object. Operation 1208 includes generating and/or displaying an estimate of a spatial map of the atomic number and the density of the object based on at least the positions and the directions of the charged particles that exit the object.

In this patent document, the word "exemplary" is used to mean serving as an example, instance, or illustration. Any embodiment or design described herein as "exemplary" is not necessarily to be construed as preferred or advantageous over other embodiments or systems. Rather, use of the word exemplary is intended to present concepts in a concrete manner.

The disclosed and other embodiments and the functional operations described in this document can be implemented in digital electronic circuitry, or in computer software, firmware, or hardware, including the structures disclosed in this document and their structural equivalents, or in combinations of one or more of them. The disclosed and other embodiments can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal, that is generated to encode information for transmission to suitable receiver apparatus.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this document can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A scanner for interrogating contents of a volume comprising:
    an accelerator structured to generate a beam of charged particles;
    a chamber located in a path of the beam of charged particles to receive the beam of charged particles;
    a beam distribution system located in the chamber to receive the beam of charged particles and structured to distribute the beam of charged particles over a range of incidence angles and positions;
    a scan-volume stage located in a path of the beam of charged particles from the chamber, the scan-volume stage configured to support an object to be scanned, and the scan-volume stage operable to move the object relative to the beam of charged particles;
    a first particle tracking detector located relative to the scan-volume stage to receive charged particles that transit through the object and to measure position and direction of the charged particles that transit through the object while allowing the charged particles to pass through;

a calorimeter located relative to the first particle tracking detector to receive the charged particles from the first particle tracking detector and to measure the received charged particles to represent energy of the charged particles received by the first particle tracking detector; and a processor communicably coupled to the first particle tracking detector and the calorimeter to process information from the first particle tracking detector and the calorimeter to yield an estimate of a spatial map of atomic number and density of the object.

2. The scanner of claim 1, wherein the beam distribution system further comprises:

a bend magnet structured to receive the charged particles from the accelerator and structured to orient the electrons toward the object under inspection; and a plurality of scattering foils to receive the charged particles from the bend magnet, wherein the plurality of scattering foils distribute the beam of charged particles over the range of incidence angles.

3. The scanner of claim 1, wherein the first particle tracking detector comprises two or more layers of charged particle detectors with each layer being perpendicular to at least one other layer and each layer including a plurality of charged particle detectors parallel to each other and structured to convert deposited energy from at least some of the charged particles into electrical current.

4. The scanner of claim 3, wherein the charged particle detectors comprise scintillating fibers coupled with silicon photomultiplier sensors.

5. The scanner of claim 1, further comprising:

a second particle tracking detector located relative to the scan-volume stage and opposite to the first particle tracking detector system, wherein the second particle tracking detector structured to receive and measure position and direction of the charged particles before the charged particles transit though the object while allowing the charged particles to pass through, and wherein the second particle tracking detector is communicably coupled to the processor to send information to the processor.

6. The scanner of claim 5, wherein the second particle tracking detector comprises two or more layers of charged particle detectors with each layer being perpendicular to at least one other layer and each layer including a plurality of charged particle detectors parallel to each other and structured to convert deposited energy from at least some of the charged particles into electrical current.

7. The scanner of claim 6, wherein the charged particle detectors comprise scintillating fibers coupled to silicon photomultiplier sensors.

8. The scanner of claim 1, wherein the scan-volume stage is a conveyor belt.

9. The scanner of claim 1, wherein the beam of charged particles include electrons.

10. The scanner of claim 1, wherein the atomic number is an average atomic number of materials associated with or included in the object.

11. The scanner of claim 1, wherein the calorimeter includes a scintillator coupled to a photomultiplier tube (PMT), wherein the scintillator is structured to converted the charged particles from the first particle tracking detector into photons, wherein the PMT is structured to convert the photons to electrical current, and wherein the energy of the charged particles received by the first particle tracking detector is based on the electrical current.

12. A method of operating a scanner for interrogating contents of a volume, the method comprising:

generating a beam of charged particles;

distributing the beam of charged particles over a range of incidence angles and positions to enter an object to be scanned;

detecting positions and directions of the charged particles that exit the object; and generating an estimate of a spatial map of the atomic number and the density of the object based on at least the positions and the directions of the charged particles that exit the object.

13. The method of claim 12, further comprising:

moving the object to be scanned through the range of incidence angles and the positions of the beam of charged particles that enter the object.

14. The method of claim 12, wherein the distributing comprises adjusting the beam of charged particles from a horizontal orientation received from a source of the beam of charged particles to a vertical orientation that enables the beam of charged particles to be directed towards the object to be scanned.

15. The method of claim 12, further comprising:

determining scatter angles of the charged particles using at least the positions and the directions of the charged particles that exit the object, wherein the atomic number and the density of the object are proportional to the scatter angles.

16. The method of claim 15, further comprising:

detecting positions and directions of the beam of charged particles before the beam of charged particles enter the object, wherein the scatter angles are determined based on the positions of the beam of charged particles before the beam of charged particles enter the object and based on the positions of the charged particles that exit the object.

17. The method of claim 12, further comprising:

measuring energy of the charged particles that exit the object;

determining energy loss of the charged particles based on the measured energy and an energy of the beam of charged particles that enter the object; and determining an estimate of the density of a part of the object along a path of the beam of charged particles based on the energy loss, wherein the density of the part of the object is proportional to the energy loss.

18. The method of claim 12, wherein the beam of charged particles includes electrons.

19. The method of claim 12, wherein the atomic number is an average atomic number of materials associated with or included in the object.

20. The method of claim 12, wherein the spatial map is a three-dimensional (3D) reconstruction of the object.

* * * * *

UNITED STATES PATENT AND TRADEMARK OFFICE
CERTIFICATE OF CORRECTION

PATENT NO. : 11,152,190 B2
APPLICATION NO. : 16/853529
DATED : October 19, 2021
INVENTOR(S) : Penny et al.

Page 1 of 1

It is certified that error appears in the above-identified patent and that said Letters Patent is hereby corrected as shown below:

In the Specification

In Column 3, Line 27, delete "90" and insert -- 90° --, therefor.

In Column 12, Line 55, delete "FIG." and insert -- FIGS. --, therefor.

In the Claims

In Column 16, Line 4, in Claim 11, delete "converted" and insert -- convert --, therefor.

Signed and Sealed this
Ninth Day of August, 2022

Katherine Kelly Vidal
*Director of the United States Patent and Trademark Office*